US007911243B2

(12) United States Patent
Ngo et al.

(10) Patent No.: US 7,911,243 B2
(45) Date of Patent: Mar. 22, 2011

(54) DRIVER WITH PROGRAMMABLE POWER COMMENSURATE WITH DATA-RATE (75) Inventors: Tuan Van Ngo, Lakeville, MN (US); Jeremy Robert Kuehlwein, Woodburry, MN (US); Marius Vicentiu Dina, Inver Grove, MN (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/102,118

(22) Filed: Apr. 14, 2008

(65) Prior Publication Data
US 2008/0265951 A1 Oct. 30, 2008

Related U.S. Application Data (60) Provisional application No. 60/913,144, filed on Apr. 20, 2007.

(51) Int. Cl.
*H03B 1/00* (2006.01)

(52) U.S. Cl. ........................................ 327/108; 327/110

(58) Field of Classification Search .......... 327/108–112, 327/170; 326/82
See application file for complete search history.

(56) References Cited

U.S. PATENT DOCUMENTS

| 6,429,987 | B1 | 8/2002 | Cheng |
| 6,538,464 | B2 | 3/2003 | Muljono et al. |
| 6,559,676 | B1* | 5/2003 | Tomita ........................... 326/81 |
| 6,970,496 | B1 | 11/2005 | Ben-Bassat et al. |
| 7,030,840 | B2* | 4/2006 | Mametsuka ................... 345/76 |
| 7,064,575 | B2 | 6/2006 | Lou |
| 7,141,939 | B2* | 11/2006 | Nagasawa et al. ............ 315/291 |
| 7,236,012 | B2* | 6/2007 | Cho et al. ........................ 326/83 |
| 7,489,186 | B2* | 2/2009 | Segarra .............................. 330/2 |
| 2006/0244479 | A1 | 11/2006 | Major |
| 2009/0115465 | A1* | 5/2009 | Garcia et al. .................. 327/111 |

* cited by examiner

*Primary Examiner* — Long Nguyen
(74) *Attorney, Agent, or Firm* — Dawn V. Stephens; Wade James Brady, III; Frederick J. Telecky, Jr.

(57) ABSTRACT

One embodiment of the invention includes a driver circuit. The driver circuit comprises an output transistor that is biased to provide an output signal in response to an input signal. The driver circuit also comprises at least one programmable variable resistor configured to provide a bias magnitude of the output transistor that sets a power of the driver circuit to be commensurate with a data-rate of the input signal.

8 Claims, 5 Drawing Sheets

DRIVER WITH PROGRAMMABLE POWER COMMENSURATE WITH DATA-RATE

RELATED APPLICATIONS

The present invention claims priority from U.S. Provisional Patent Application No. 60/913,144, filed Apr. 20, 2007, entitled: "Low Power, High Speed Matched Load Write Driver".

TECHNICAL FIELD

This invention relates to electronic circuits, and more specifically to a driver with a programmable power commensurate with data-rate.

BACKGROUND

Driver circuits are used in numerous applications. As an example, driver circuits such as any of a variety of classes of amplifiers, can be implemented in the transmission of data to a different medium, such as for wireless transmission or for writing data to a magnetic medium. Due to the increasing demand for faster data transfer, some driver circuits may be required to provide a very rapid data-rate. As an example, in high-end/enterprise-class disk-drives, such as computer servers, a data-rate provided by a driver circuit can be greater than 2 gigabits per second (Gbs) to support a disk-drive of greater than 12,000 RPM. However, other driver circuits may have data-rate requirements of a lesser magnitude. As an example, preamplifier drivers that are used in desktop or laptop hard-drives can have a data-rate that is between 1 and 2 Gbs.

Multiple driver circuits that operate together to provide signals to an output medium, such as a magnetic disk-drive, can typically be implemented together in an integrated circuit. Such integrated circuits can be standardized, such that a given integrated circuit that includes one or more write driver circuits can be implemented in any magnetic disk write system. However, power requirements may change depending on the data-rate that is required for the driver circuit(s). As an example, for the high-end/enterprise-class disk-drives, such as computer servers, a relatively high power consumption (e.g., approximately 2-3 watts) can be required to support the data-rate of the driver. As another example, hard-drives that are implemented in desktop or laptop computers may consume less power (e.g., approximately 1-2 watts) to support the data-rate of the driver.

SUMMARY

One embodiment of the invention includes a driver circuit. The driver circuit comprises an output transistor that is biased to provide an output signal in response to an input signal. The driver circuit also comprises at least one programmable variable resistor configured to provide a bias magnitude of the output transistor that sets a power of the driver circuit to be commensurate with a data-rate of the input signal.

Another embodiment of the invention includes a method of driving an input signal to provide an output signal. The method comprises determining the data rate of the input signal. The method also comprises programming at least one respective variable resistor via a resistance selection signal to provide a bias magnitude of an output transistor that sets an associated power to be commensurate with the data rate of the input signal. The method further comprises controlling the output transistor to provide the output signal based on the input signal.

Another embodiment of the invention includes a driver circuit. The driver circuit comprises means for providing an output signal in response to an input signal, and means for providing a bias to the means for providing an output signal. The method further comprises means for means for programmably providing a bias magnitude of the bias to set a power of the driver circuit commensurate with a data rate of the input signal.

DETAILED DESCRIPTION

The invention relates to electronic circuits, and more specifically to a driver with a programmable power commensurate with data-rate. The driver includes at least one programmable variable resistor interconnected between a bias node of a respective output transistor and a voltage source, such as a positive or negative voltage rail. The bias node can also be coupled to a bias transistor that is controlled by the input signal to the driver. Therefore, the programmable variable resistor can provide a current flow that is commensurate with a data-rate associated with a frequency of the output signal based on the switching of the output transistor, such that the current flow sets the bias that is commensurate with the data-rate. As a result, power can be conserved for the driver circuit, such as in a magnetic disk write system, for slower data-rates by programming less current flow through the programmable variable resistor.

Figure 1:
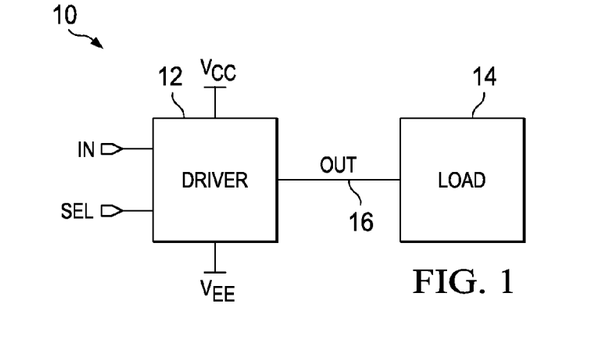
FIG. 1 illustrates an example of a signal driver system in accordance with an aspect of the invention.

FIG. 1 illustrates an example of a signal driver system 10 in accordance with an aspect of the invention. The signal driver system 10 includes a signal driver 12 coupled to a load 14 via transmission line 16. The signal driver 12 is demonstrated in the example of FIG. 1 as being interconnected between a positive rail voltage $V_{CC}$ and a negative rail voltage $V_{EE}$. The signal driver 12 can include any of a variety of driver circuits, such as a class-AB driver. Therefore, the signal driver 12 can be configured to receive an input signal IN and provide an output signal OUT, such that the output signal OUT can be a buffered and/or amplified version of the input signal IN. The transmission line 16 transmits the output signal OUT from the signal driver 12 to the load 14. The load 14 can be any of a variety of devices that implement the buffered/amplified output signal OUT, such as an inductive load utilized in a magnetic disk write system.

In the example of FIG. 1, the signal driver 12 receives a resistance selection signal SEL. The resistance selection signal SEL can be configured to set a resistance magnitude of one or more programmable variable resistors. As an example, the one or more programmable variable resistors can be configured to supply current to a bias terminal of one or more respective output transistors to provide the output signal OUT. Therefore, the resistance of the programmable variable resistors, and thus the current provided through the programmable variable resistors, can be controlled such that it is commensurate with a data-rate of the signal driver 12. Accordingly, the signal driver 12 can be substantially standardized for implementation in any of a variety of driver applications to provide sufficient power for any demand necessary to satisfy a data-rate requirement.

As an example, the load 14 can be configured as a magnetic disk-drive in a server or enterprise-class system. Therefore, the resistance selection signal SEL can be set to provide a relatively high power consumption within the signal driver 12 to be able to satisfy the high data-rate required by the magnetic disk-drive. As another example, the load 14 can be configured as a hard-drive in a laptop or desktop computer. Therefore, the resistance selection signal SEL can be set to provide a lower power consumption within the signal driver 12 to be able to satisfy the lower data-rate required by the hard-drive relative to a server magnetic disk-drive system. As yet another example, the resistance selection signal SEL can be dynamically set to support variable data-rates. As an example, a magnetic disk write system may include a magnetic disk-drive that spins the magnetic disk at a constant angular velocity. Therefore, a data-rate of the magnetic disk-drive can be proportional to a radial distance of the disk write head position relative to a center of the magnetic disk, such that the disk-drive has higher data-rates at an outer-edge relative to an inner-edge of the magnetic disk. As a result, the power that is provided to the signal driver 12 via the resistance selection signal SEL is commensurate with the data-rate, such that power is provided based on the power that is demanded as stipulated by the data-rate.

Figure 2:
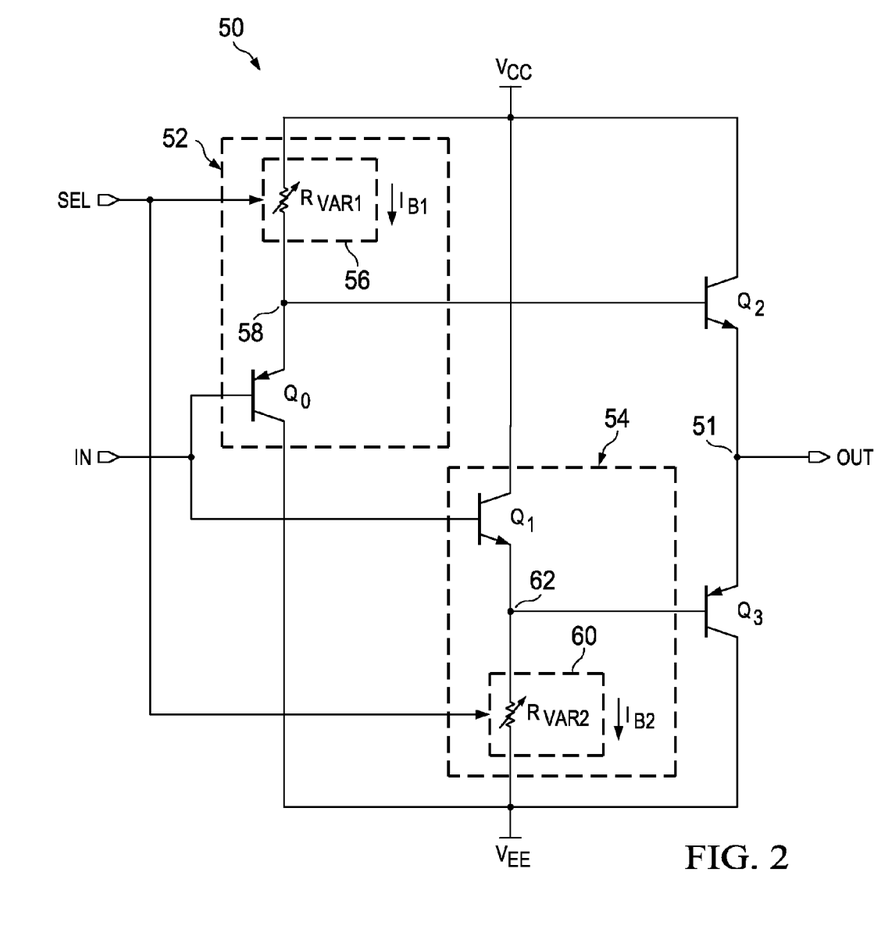
FIG. 2 illustrates an example of a driver circuit in accordance with an aspect of the invention.

FIG. 2 illustrates an example of a driver circuit 50 in accordance with an aspect of the invention. The driver circuit 50 can correspond to the signal driver 12 in the example of FIG. 1. Therefore, the driver circuit 50 receives an input signal IN and provides an output signal OUT at an output 51 onto transmission lines to a load, such as to a magnetic disk write head. Accordingly, reference is to be made to the example of FIG. 1 in the following discussion of the example of FIG. 2.

The driver circuit 50 interconnects a positive rail voltage $V_{CC}$ and a negative rail voltage $V_{EE}$. As an example, the voltage range between the positive rail voltage $V_{CC}$ and the negative rail voltage $V_{EE}$ can be substantially centered at ground. As such, the positive rail voltage $V_{CC}$ can be positive relative to ground and the negative rail voltage $V_{EE}$ can be negative relative to ground. Therefore, as described in greater detail below, the input signal IN and the output signal OUT can be positive and negative pulses relative to a cross-over voltage that is approximately zero volts. However, it is to be understood that that cross-over voltage is not limited to being zero volts, such that the input pulses can be between any of a variety of voltage ranges (e.g., 0-5 volts).

The driver circuit 50 includes a first bias circuit 52 and a second bias circuit 54 that are each coupled to the input signal IN. The first bias circuit 52 includes a first programmable variable resistor 56 and a PNP-type bipolar junction transistor (BJT) $Q_0$. The first programmable variable resistor 56 provides a current $I_{B1}$ from the positive rail voltage $V_{CC}$ to a first bias node 58. The transistor $Q_0$ is biased by the input signal IN and has a collector that is coupled to the negative rail voltage $V_{EE}$ and an emitter that is coupled to the first bias node 58. Therefore, at decreasing magnitudes of the input signal IN, the transistor $Q_0$ is activated more, thus conducting more of the current $I_{B1}$ through the transistor $Q_0$. As a result, the first bias node 58 has a voltage magnitude that decreases as the magnitude of the input signal IN decreases. However, at increasing magnitudes of the input signal IN, the transistor $Q_0$ is deactivated more, thus conducting less of the current $I_{B1}$ through the transistor $Q_0$. As a result, the first bias node 58 has a voltage magnitude that increases as the magnitude of the input signal IN increases, with a greatest magnitude occurring at a cutoff region of the transistor $Q_0$.

The second bias circuit 54 includes a second programmable variable resistor 60 and an NPN-type transistor $Q_1$. The second programmable variable resistor 60 provides a current $I_{B2}$ to the negative rail voltage $V_{EE}$ from a second bias node 62. The transistor $Q_1$ is biased by the input signal IN and has a collector that is coupled to the positive rail voltage $V_{CC}$ and an emitter that is coupled to the second bias node 62. Therefore, at decreasing magnitudes of the input signal IN, the transistor $Q_1$ is deactivated more, thus conducting less of the current $I_{B2}$ through the transistor $Q_1$. As a result, the second bias node 62 has a voltage magnitude that decreases as the magnitude of the input signal IN decreases, with a least magnitude occurring at a cutoff region of the transistor $Q_1$. However, at increasing magnitudes of the input signal IN, the transistor $Q_1$ is activated more, thus conducting more of the current $I_{B2}$ through the transistor $Q_1$. As a result, the second bias node 62 has a voltage magnitude that increases as the magnitude of the input signal IN increases.

The driver circuit 50 also includes a high-side transistor and a low-side transistor, demonstrated in the example of FIG. 2 as an NPN-type transistor $Q_2$ and a PNP-type transistor $Q_3$, respectively. The transistor $Q_2$ is biased by the first bias node 58 and has a collector coupled to the positive rail voltage $V_{CC}$ and an emitter coupled to the output 51. The transistor $Q_3$ is biased by the second bias node 62 and has a collector coupled to the negative rail voltage $V_{EE}$ and an emitter coupled to the output 51. The transistor $Q_2$ is thus configured to source current from the positive rail voltage $V_{CC}$ to the output 51 and the transistor $Q_3$ is thus configured to sink current from the output 51 to the negative rail voltage $V_{EE}$.

As demonstrated in the example of FIG. 2, based on the configuration of the driver circuit 50, at increasing magnitudes of the input signal IN, the voltage at the first bias node 58 increases. In response, the transistor $Q_2$ activates to source current from the positive rail voltage $V_{CC}$ to the output 51, such that the output signal OUT likewise has an increasing magnitude. Similarly, at decreasing magnitudes of the input signal IN, the voltage at the second bias node 62 decreases. In response, the transistor $Q_3$ activates to sink current from the output 51 to the negative rail voltage $V_{EE}$, such that the output signal OUT likewise has a decreasing magnitude.

As described in the example of FIG. 1, the driver circuit 50 receives a resistance selection signal SEL to set a variable resistance $R_{VAR1}$ associated with the first programmable variable resistor 56 and a variable resistance $R_{VAR2}$ associated with the second programmable variable resistor 60. The variable resistances $R_{VAR1}$ and $R_{VAR2}$ may be set substantially equal, or could be set differently relative to each other. As an example, the resistance selection signal SEL can be implemented as a digital signal and can include one or more bits. As a result, the respective currents $I_{B1}$ and $I_{B2}$ that are provided to the respective bias nodes 58 and 62 via the first and second programmable variable resistors 56 and 60 can be varied, such as based on a required data-rate of the driver circuit 50. Thus, the magnitude of the current $I_{B1}$ sets the bias of the transistor $Q_2$ in conjunction with the operation of the transistor $Q_0$, and the magnitude of the current $I_{B2}$ sets the bias of the transistor $Q_3$ in conjunction with the operation of the transistor $Q_1$. Therefore, the variable magnitudes of the currents $I_{B1}$ and $I_{B2}$ can control a speed of operation of the respective transistors $Q_2$ and $Q_3$, such as to support the required data-rate of the driver circuit 50. Accordingly, the power consumption of the driver circuit 50 can likewise be controlled, such that only an amount of power that is demanded based on the required data-rate of the driver circuit 50 is provided.

It is to be understood that the driver circuit 50 is not intended to be limited to the example of FIG. 2. As an example, the driver circuit 50 is demonstrated in the example of FIG. 2 as a class-AB driver. However, the driver circuit 50 is not limited to implementation as a class-AB driver, but could be implemented as any of a variety of drivers. As another example, the transistors $Q_0$ through $Q_3$ are not limited to BJTs, but can instead be implemented as field effect transistors (FETs). In addition, the bias circuits 52 and 54 can be configured in any of a variety of ways to provide the bias voltages to the bases of the transistors $Q_2$ and $Q_3$. As yet another example, the driver circuit 50 can include one or more impedance matching resistors coupled to the output 51, such as to minimize signal reflections. Furthermore, although the example of FIG. 2 demonstrates that the resistance selection signal SEL is provided to both of the first and second programmable variable resistors 56 and 60, the first and second programmable variable resistors 56 and 60 could receive separate signals, such that the variable resistances $R_{VAR1}$ and $R_{VAR2}$ can be set independently. Accordingly, the driver circuit 50 can be configured in any of a variety of ways.

Figure 3:
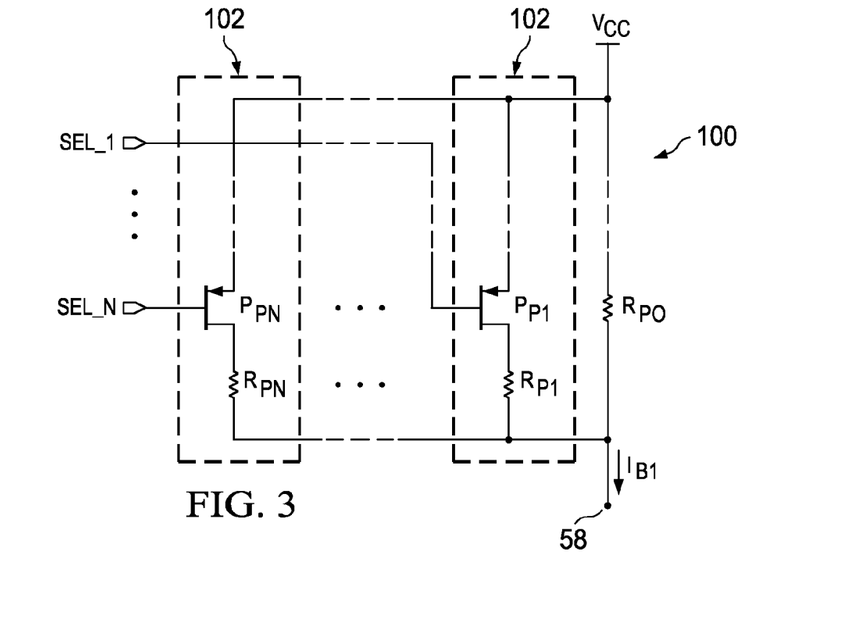
FIG. 3 illustrates an example of a programmable variable resistor in accordance with an aspect of the invention.

FIG. 3 illustrates an example of a programmable variable resistor 100 in accordance with an aspect of the invention. The programmable variable resistor 100 can be implemented as the first programmable variable resistor 56 in the example of FIG. 2. Therefore, reference is to be made to the example of FIG. 2 in the following discussion of the example of FIG. 3.

The programmable variable resistor 100 interconnects the positive rail voltage $V_{CC}$ and the bias node 58 and includes a first resistor $R_{P0}$. The first resistor $R_{P0}$ is coupled to both the positive rail voltage $V_{CC}$ and the bias node 58. The programmable variable resistor 100 also includes at least one additional current-path 102 that can be coupled in parallel with the first resistor $R_{P0}$. In the example of FIG. 3, the at least one additional current-path 102 is demonstrated as numbering between 1 and N, where N is a positive integer, such that N could be 1. Each additional current-path 102 includes a resistor $R_P$, demonstrated as $R_{P1}$ to $R_{PN}$, and a P-type field effect transistor (FET), demonstrated as $P_{P1}$ to $P_{PN}$. Each of the P-FETs $P_{P1}$ to $P_{PN}$ are activated based on the resistance selection signal SEL, which is demonstrated in the example of FIG. 3 as sub-signals SEL_1 to SEL_N, such that each of the sub-signals SEL_1 to SEL_N can represent one bit of the digital resistance selection signal SEL.

The resistance selection sub-signals SEL_1 to SEL_N are thus configured to selectively activate one or more of the at least one additional current-paths 102, such that the activated one or more additional current-paths 102 become coupled in parallel to the first resistor $R_{P0}$. Specifically, upon a logic-low state of a given one of the resistance selection sub-signals SEL_1 to SEL_N, the respective one of the P-FETs $P_{P1}$ to $P_{PN}$ is activated to parallel-connect the respective one of the resistors $R_{P1}$ to $R_{PN}$ to the first resistor $R_{P0}$. Therefore, the effective resistance magnitude $R_{VAR1}$ of the programmable variable resistor 100 is reduced, resulting in a greater magnitude of the current $I_{B1}$ flowing through the programmable variable resistor 100 based on the additional current flow through the activated additional current-path 102.

Figure 4:
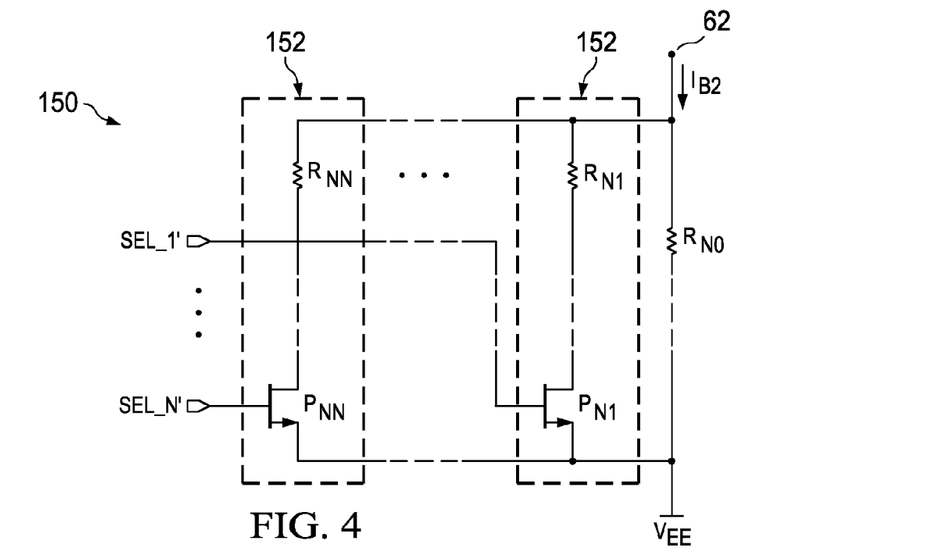
FIG. 4 illustrates another example of a programmable variable resistor in accordance with an aspect of the invention.

FIG. 4 illustrates another example of a programmable variable resistor 150 in accordance with an aspect of the invention. The programmable variable resistor 150 can be implemented as the second programmable variable resistor 60 in the example of FIG. 2. Therefore, reference is to be made to the example of FIGS. 2 and 3 in the following discussion of the example of FIG. 4.

The programmable variable resistor 150 interconnects the negative rail voltage $V_{EE}$ and the bias node 62 and includes a first resistor $R_{N0}$. The first resistor $R_{N0}$ is coupled to both the negative rail voltage $V_{EE}$ and the bias node 62. The programmable variable resistor 150 also includes at least one additional current-path 152 that can be coupled in parallel with the first resistor $R_{N0}$. In the example of FIG. 4, the at least one additional current-path 152 is demonstrated as numbering between 1 and N, where N is a positive integer that could be 1. Each additional current-path 152 includes a resistor $R_N$, demonstrated as $R_{N1}$ to $R_{NN}$, and an N-type FET, demonstrated as $P_{N1}$ to $P_{NN}$. Each of the P-FETs $P_{N1}$ through $P_{NN}$ are activated based on the resistance selection signal SEL. However, in the example of FIG. 4, the resistance selection signal SEL is demonstrated as sub-signals SEL_1' to SEL_N', such that each of the sub-signals SEL_1' to SEL_N' can represent one bit of the digital resistance selection signal SEL having an opposite binary-state as the sub-signals SEL_1 to SEL_N demonstrated in the example of FIG. 3.

The resistance selection sub-signals SEL_1' to SEL_N' are thus configured to selectively activate one or more of the at least one additional current-paths 152, such that the activated one or more additional current-paths 152 become coupled in parallel to the first resistor $R_{N0}$. Specifically, upon a logic-high state of a given one of the resistance selection sub-signals SEL_1' to SEL_N', the respective one of the P-FETs $P_{N1}$ to $P_{NN}$ is activated to parallel-connect the respective one of the resistors $R_{N1}$ to $R_{NN}$ to the first resistor $R_{N0}$. Therefore, the effective resistance magnitude $R_{VAR2}$ of the programmable variable resistor 150 is reduced, resulting in a greater magnitude of the current $I_{B2}$ flowing through the programmable variable resistor 150 based on the additional current flow through the activated additional current-path 152.

It is to be understood that the programmable variable resistors 100 and 150 are not intended to be limited to the examples of FIGS. 3 and 4. As an example, the respective resistance selection sub-signals SEL_1 to SEL_N and SEL_1' to SEL_N' are not limited to being complementary, and can be separate and independently controlled relative to each other. As another example, the resistors $R_{P1}$ to $R_{PN}$ and can each have different resistance values the resistors $R_{N1}$ to $R_{NN}$ can each have different resistance values. As such, the respective resistance selection sub-signals SEL_1 to SEL_N and SEL_1' to SEL_N' can activate a single respective current path 102 and 152 to select the desired respective resistances $R_{VAR1}$ and $R_{VAR2}$, or can activate any of a variety of combinations of the current paths 102 and 152 to provide a broad range of the respective resistances $R_{VAR1}$ and $R_{VAR2}$. As a further example, additional circuit devices and/or resistance control signals can be implemented for each of the programmable variable resistors 100 and 150. Accordingly, the programmable variable resistors 100 and 150 can each be configured in any of a variety of ways.

Figure 5:
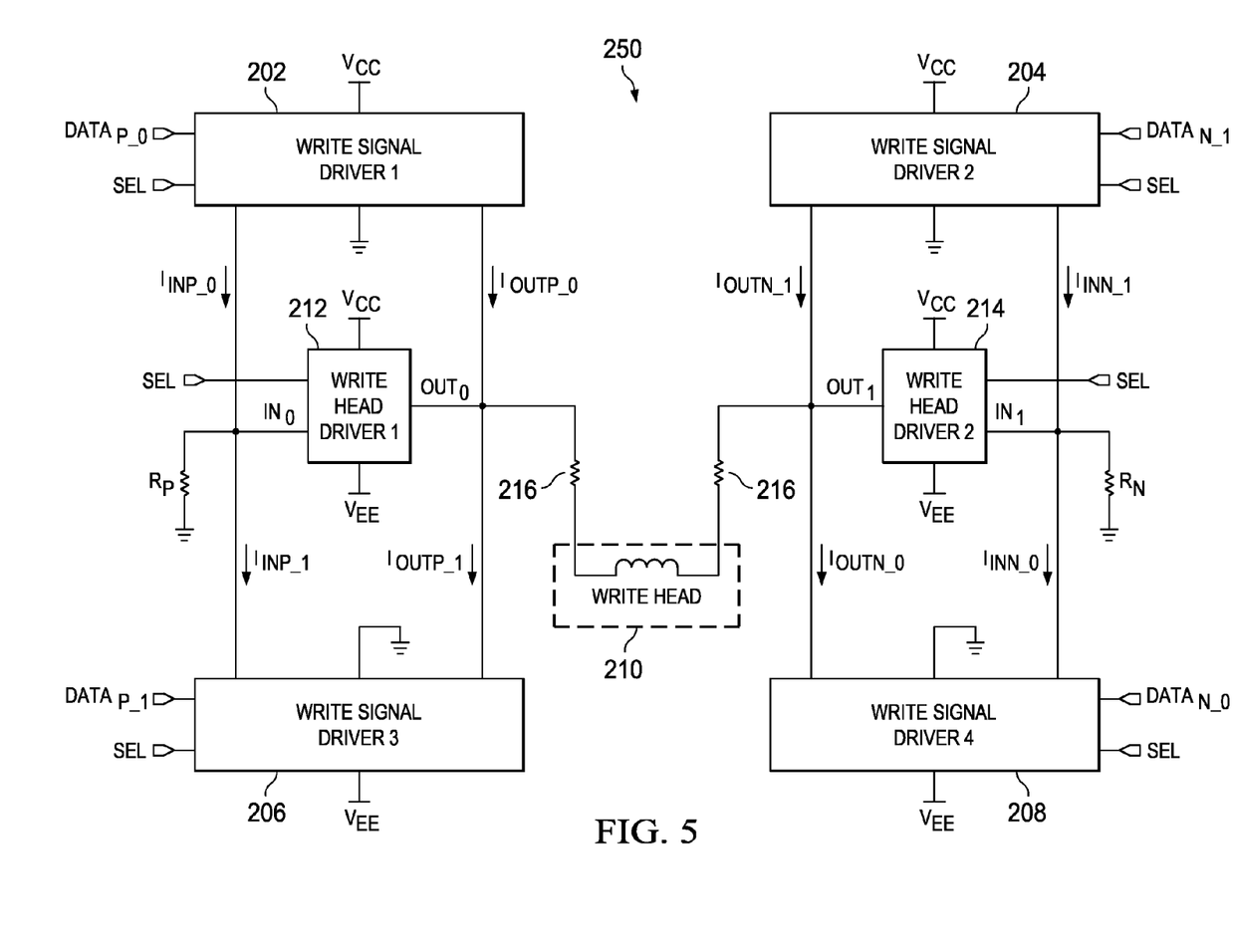
FIG. 5 illustrates an example of a magnetic disk write system in accordance with an aspect of the invention.

FIG. 5 illustrates an example of a magnetic disk write system 200 in accordance with an aspect of the invention. As an example, the magnetic disk write system 200 can be configured to write data to a hard-drive of a desktop or laptop computer, to a peripheral magnetic storage medium, or to a magnetic storage disk of a server or enterprise-class computer.

The system 200 includes a first write signal driver 202, a second write signal driver 204, a third write signal driver 206, and a fourth write signal driver 208. The first write signal driver 202 interconnects a positive rail voltage $V_{CC}$ and ground, and receives a data signal $DATA_{P\_0}$ as an input. The second write signal driver 204 interconnects the positive rail voltage $V_{CC}$ and ground, and receives a data signal $DATA_{N\_1}$ as an input. The third write signal driver 206 interconnects ground and a negative rail voltage $V_{EE}$, and receives a data signal $DATA_{P\_1}$ as an input. The fourth write signal driver 208 interconnects ground and the negative rail voltage $V_{EE}$, and receives a data signal $DATA_{N\_0}$ as an input. As an example, the first through fourth write signal drivers 202 through 208 can include multiple driver stages and a current output stage. The data signals $DATA_{P\_0}$, $DATA_{P\_1}$, $DATA_{N\_0}$, and $DATA_{N\_1}$ can collectively correspond to a data signal DATA that represents a data stream to be written to a magnetic storage medium (not shown) via a write head 210. As an example, the data signals $DATA_{P\_0}$, $DATA_{P\_1}$, $DATA_{N\_0}$, and $DATA_{N\_1}$ can be signals having respective analog magnitudes that correspond to the desired digital data to be written to the magnetic storage medium.

For example, the data signals $DATA_{P\_0}$ and $DATA_{N\_0}$ can have opposite magnitudes relative to ground at a given time to activate the respective first and fourth write signal drivers 202 and 208 concurrently. Similarly, the data signals $DATA_{P\_1}$ and $DATA_{N\_1}$ can have opposite magnitudes relative to ground at a given time to activate the respective second and third write signal drivers 204 and 206 concurrently. Therefore, the first and third write signal drivers 202 and 206 are thus configured to buffer the respective data signals $DATA_{P\_0}$ and $DATA_{P\_1}$ to drive an input signal $IN_0$ and an output signal $OUT_0$ of a first write head driver 212 in alternate logic-states. Likewise, the second and fourth write signal drivers 204 and 208 are thus configured to buffer the respective data signals $DATA_{N\_1}$ and $DATA_{N\_0}$ to drive an input signal $IN_1$ and an output signal $OUT_1$ of a second write head driver 214 in alternate logic-states. The first and second write head drivers 212 and 214 can each be configured substantially similar to the driver circuit 50 in the example of FIG. 2, and can each drive the output signals $OUT_0$ and $OUT_1$ as matched impedance currents to the write head 210.

As an example, the data signals $DATA_{P\_0}$ and $DATA_{P\_1}$ can each have a magnitude less than zero and the data signals $DATA_{N\_0}$ and $DATA_{N\_1}$ can each have a magnitude greater than zero concurrently. As a result, the first and fourth write signal drivers 202 and 208 can each be activated and the second and third write signal drivers 204 and 206 can each be deactivated. Therefore, a current $I_{INP\_0}$ and a current $I_{OUTP\_0}$ are sourced from the first write signal driver 202, and a current $I_{INN\_0}$ and a current $I_{OUTN\_0}$ are sunk to the fourth write signal driver 208. The current $I_{INP\_0}$ is discharged to ground through a resistor $R_P$ to set the input signal $IN_0$ to a logic-high state, and the current $I_{INN\_0}$ flows from ground through a resistor $R_N$ to set the input signal $IN_1$ to a logic-low state. As a result, the respective output signals $OUT_0$ and $OUT_1$ can follow the respective logic-states of the input signals $IN_0$ and $IN_1$, such that the current $I_{OUTP\_0}$, along with an impedance matching current provided by the output signal $OUT_0$, flows through the write head 210 via transmission lines 216 and is sunk to the negative voltage rail $V_{EE}$ as the current $I_{OUTN\_0}$. As an example, the write head 210 can include an inductive load to generate a magnetic field in response to the current flow through it. Accordingly, the magnetic field can set a polarity of one or more portions of the magnetic medium, such as the magnetic disk, to correspond to a first binary-state of the data signal DATA.

As another example, the data signals $DATA_{N\_1}$ and $DATA_{N\_0}$ can each have a magnitude greater than zero and the data signals $DATA_{P\_0}$ and $DATA_{P\_1}$ can each have a magnitude less than zero concurrently. As a result, the second and third write signal drivers 204 and 206 can each be activated and the first and fourth write signal drivers 202 and 208 can each be deactivated. Therefore, a current $I_{INN\_1}$ and a current $I_{OUTN\_1}$ are sourced from the second write signal driver 204, and a current $I_{INP\_1}$ and a current $I_{OUTP\_1}$ are sunk to the third write signal driver 206. The current $I_{INN\_1}$ is discharged to ground through the resistor $R_N$ to set the input signal $IN_1$ to a logic-high state, and the current $I_{INP\_1}$ flows from ground through the resistor $R_P$ to set the input signal $IN_0$ to a logic-low state. As a result, the respective output signals $OUT_0$ and $OUT_1$ can follow the respective logic-states of the input signals $IN_0$ and $IN_1$, such that the current $I_{OUTN\_1}$, along with an impedance matching current provided by the output signal $OUT_1$, flows through the write head 210 via the transmission lines 216 and is sunk to the negative voltage rail $V_{EE}$ as the current $I_{OUTP\_1}$. Accordingly, the magnetic field can set a polarity of one or more portions of the magnetic medium to correspond to an opposite binary-state of the data signal DATA.

As demonstrated in the example of FIG. 5, each of the first through fourth write signal drivers 202 through 208, as well as the first and second write head drivers 212 and 214, receives a resistance selection signal SEL. Similar to as described above in the examples of FIGS. 2-4, the resistance selection signal SEL is configured to set a programmable variable resistance for one or more bias circuits, such as could be included in each of the first through fourth write signal drivers 202 through 208 and first and second write head drivers 212 and 214. As such, the power consumption of each of the first through fourth write signal drivers 202 through 208 and first and second write head drivers 212 and 214 can be set based on the data-rate demands of the magnetic disk write system 200.

As an example, the magnetic disk write system 200, excluding the write head 210 and the interconnecting transmission lines 216, can be configured as an integrated circuit (IC). Therefore, the IC including the first through fourth write signal drivers 202 through 208 and first and second write head drivers 212 and 214 can be standardized to drive the data signal DATA to any of a variety of magnetic media, from relatively low data-rate desktop and laptop hard-drives to relatively high data-rate server disk-drives. Accordingly, the resistance selection signal SEL can be set to optimize power consumption based on the demands stipulated by the data-rate of the magnetic disk write system 200, such that power can be conserved in lower data-rate applications. As another example, the data-rate can be variable, such as based on a position of the write head 210 with respect to a radial distance of the magnetic disk, such that the resistance selection signal SEL can be dynamically set by a controller (not shown) based on changes to the data-rate. Therefore, power consumption can likewise be conserved in response to decreases in the data-rate during operation of the magnetic disk write system 200.

It is to be understood that the magnetic disk write system 200 is not intended to be limited to the example of FIG. 5. As an example, the magnetic disk write system 200 is demonstrated in the example of FIG. 5 simplistically. As such, the magnetic disk write system 200 can include interconnections between the first through fourth write signal drivers 202 through 208 with respect to each other and additional interconnections with respect to the first and second write head drivers 212 and 214. In addition, other configurations of write signal drivers and write head drivers are possible for a given magnetic disk write system. Accordingly, the magnetic disk write system 200 can be configured in any of a variety of ways.

Figure 6:
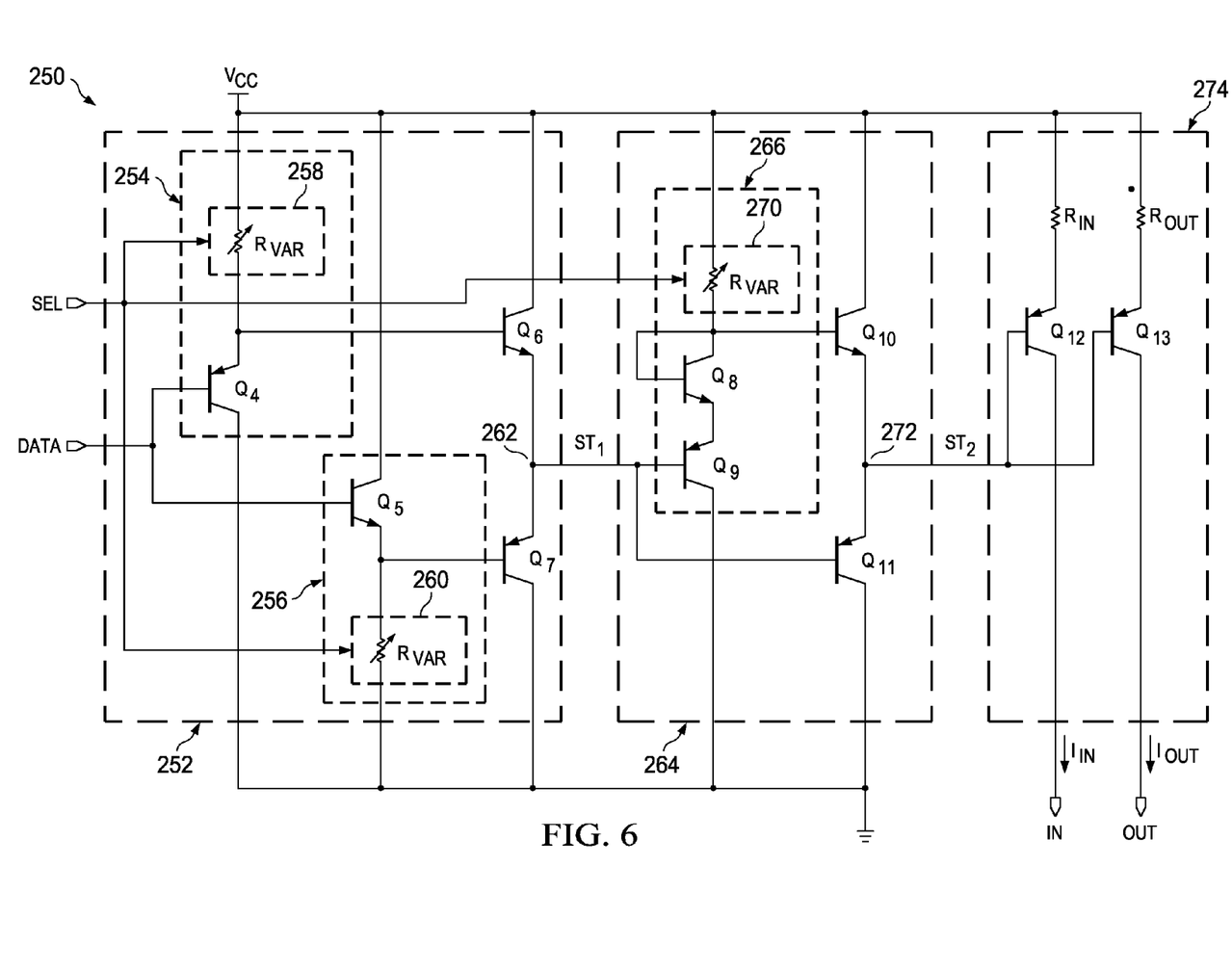
FIG. 6 illustrates an example of a write signal driver circuit in accordance with an aspect of the invention.

FIG. 6 illustrates an example of a write signal driver circuit 250 in accordance with an aspect of the invention. The write signal driver circuit 250 interconnects the positive rail voltage $V_{CC}$ and ground, and can thus correspond to the first or second write signal driver 202 or 204 in the example of FIG. 5. Therefore, reference is to be made to the example of FIG. 5 in the following discussion of the example of FIG. 6.

The write signal driver circuit 250 includes a first driver stage 252. The first driver stage 252 includes first and second bias circuits 254 and 256 that each include a respective bias transistor $Q_4$ and $Q_5$ that are biased by a signal DATA, which could be one of the data signals $DATA_{P\_0}$ and $DATA_{N\_1}$. Each of the first and second bias circuits 254 and 256 also includes a respective programmable variable resistor 258 and 260 that receives the resistance selection signal SEL and provides a resistance magnitude of $R_{VAR}$. The first driver stage 252 also includes first and second output transistors $Q_6$ and $Q_7$ that provide a first stage output signal $ST_1$ at an output 262. Accordingly, the first driver stage 252 is configured substantially the same as the driver circuit 50 in the example of FIG. 2.

The write signal driver circuit 250 also includes a second driver stage 264 that receives the first stage output signal $ST_1$ as an input. The second driver stage 264 includes a bias circuit 266 that includes a level-shifting transistor $Q_8$ and a bias transistor $Q_9$ that is biased by the first stage output signal $ST_1$. The level-shifting transistor $Q_8$ is configured with a collector that is coupled to a bias node 268 as well as to the base of the transistor $Q_8$. The level-shifting transistor $Q_8$ is therefore diode-connected, such that it is configured to level-shift a voltage across the bias transistor $Q_9$ to a greater magnitude (e.g., 0.7 volts). The bias circuit 266 also includes a programmable variable resistor 270 that also receives the resistance selection signal SEL and provides a resistance magnitude of $R_{VAR}$. As an example, the programmable variable resistor 270 can be configured substantially similar to the programmable variable resistor 100 in the example of FIG. 3. The bias circuit 266 is configured to set a bias voltage at the bias node 268 that controls a transistor $Q_{10}$, and the first stage output signal $ST_1$ controls a transistor $Q_{11}$. Accordingly, the transistors $Q_{10}$ and $Q_{11}$ act as a high-side transistor and a low-side transistor, respectively, to provide a second stage output signal $ST_2$ at an output 272. The second stage output signal $ST_2$ is thus level-shifted based on the configuration of the second driver stage 264.

The write signal driver circuit 250 further includes an output stage 274. The output stage 274 includes a PNP-type transistor $Q_{12}$ that is coupled to the positive rail voltage $V_{CC}$ via a resistor $R_{IN}$ and a PNP-type transistor $Q_{13}$ that is coupled to the positive rail voltage $V_{CC}$ via a resistor $R_{OUT}$. In the example of FIG. 6, the transistors $Q_{12}$ and $Q_{13}$ are each activated based on a logic-low state of the second stage output signal $ST_2$, such that the transistor $Q_{12}$ provides a current $I_{IN}$ and the transistor $Q_{13}$ provides a current $I_{OUT}$. As a result, the transistor $Q_{12}$ and resistor $R_{IN}$ act as a first current source of the current $I_{IN}$ and the transistor $Q_{13}$ and the resistor $R_{OUT}$ act as a second current source of the current $I_{OUT}$, such that they are each activated by a logic-low state of the second stage output signal $ST_2$. The currents $I_{IN}$ and $I_{OUT}$ can thus correspond to the currents $I_{INP\_0}$ and $I_{OUTP\_0}$ provided from the first write signal driver 202 or the currents $I_{INN\_1}$ and $I_{OUTN\_1}$ provided from the second write signal driver 204. Therefore, the write signal driver circuit 250 is configured to drive the data signal DATA as the rectified large-load currents $I_{IN}$ and $I_{OUT}$.

As described above, the write signal driver circuit 250 can correspond to the first or second write signal driver 202 or 204 in the example of FIG. 5. However, it is to be understood that the write signal driver circuit 250 can be configured substantially similar to the third or fourth write signal driver 206 or 208. As an example, the write signal driver circuit 250 can interconnect ground and the negative rail voltage $V_{EE}$, the bias circuit 266 in the second driver stage 264 could bias the low-side transistor $Q_{11}$, and the output stage 274 could sink the currents $I_{IN}$ and $I_{OUT}$ via NPN-configured transistors $Q_{12}$ and $Q_{13}$. In addition, it is to be understood that the write signal driver circuit 250 is not intended to be limited to the example of FIG. 6. As an example, the first and/or second driver stages 252 and 264 can be configured in any of a variety of ways to activate the output stage 274 to provide the currents $I_{IN}$ and $I_{OUT}$. In addition, the second driver stage 264 could be omitted, such that the output stage 274 can be controlled directly from the first stage output signal $ST_1$. Therefore, the write signal driver circuit 250 can be configured in any of a variety of different ways in the magnetic disk write system 200.

Figure 7:
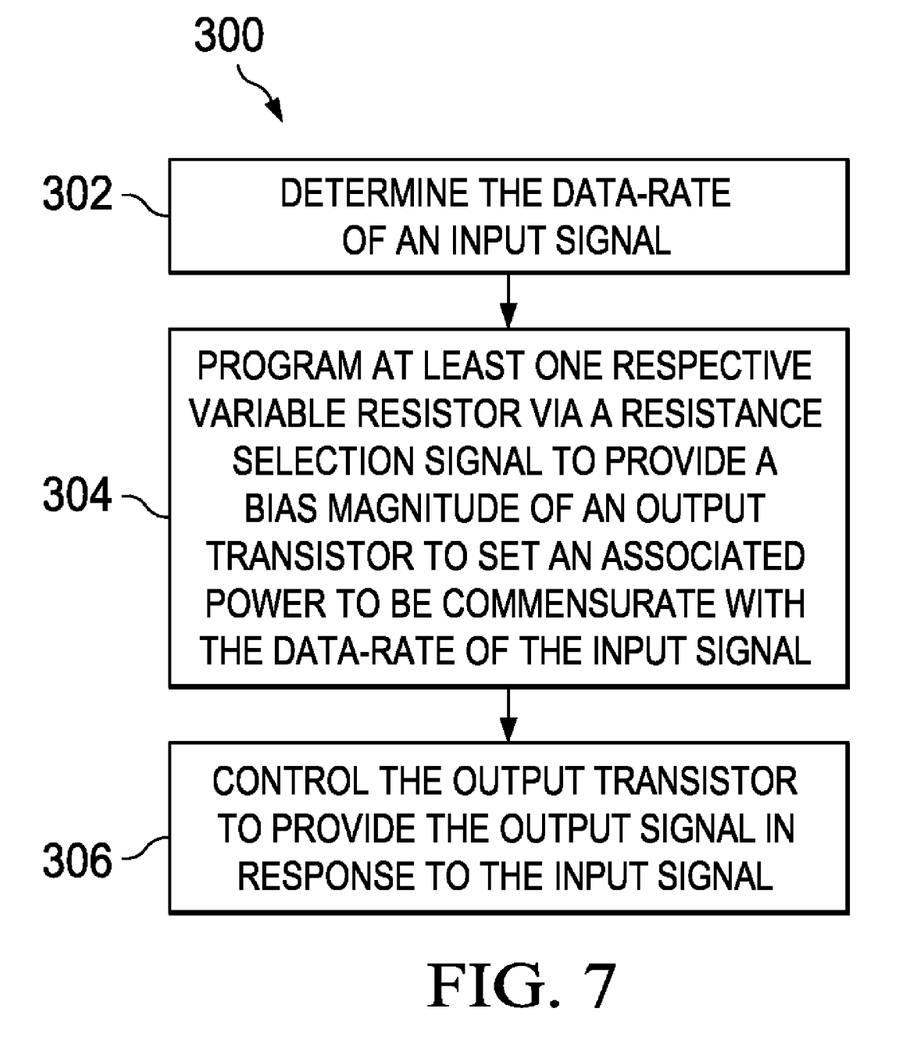
FIG. 7 illustrates an example of a method for driving an input signal to provide an output signal in accordance with an aspect of the invention.

In view of the foregoing structural and functional features described above, certain methods will be better appreciated with reference to FIG. 7. It is to be understood and appreciated that the illustrated actions, in other embodiments, may occur in different orders and/or concurrently with other actions. Moreover, not all illustrated features may be required to implement a method.

FIG. 7 illustrates an example of a method 300 for driving an input signal to provide an output signal in accordance with an aspect of the invention. At 302, a data-rate of an input signal is determined. The data-rate can be based on a type of magnetic disk write system that is implemented, such that the data-rate of the input signal can be very high for server and/or enterprise systems, and can be lower for laptop and desktop computer systems. The data-rate can also be dynamic, such as based on a radial distance from a center of a magnetic disk that has a constant angular velocity.

At 304, at least one respective variable resistor is programmed via a resistance selection signal to provide a bias magnitude of an output transistor to set an associated power to be commensurate with the data-rate of the input signal. The bias magnitude can be based on an amount of current flow through a bias node that is coupled to the base of the output transistor. The resistance selection signal can be a multi-bit digital signal, and the variable resistor can include one or more additional current paths that can be coupled in parallel with a first resistor in response to each respective bit of the digital resistance selection signal. At 306, the output transistor is controlled to provide the output signal based on the input signal. The amount of current that is provided through the bias terminal can be commensurate with a data-rate of the driver. As such, higher switching frequencies of the output signal can be supported by providing more current through the variable resistor, and thus more power, in response to greater power demands as stipulated by the data-rate.

What have been described above are examples of the invention. It is, of course, not possible to describe every conceivable combination of components or methodologies for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims.

What is claimed is:

1. A driver circuit comprising:
an output transistor that is biased to provide an output signal in response to an input signal; and
at least one programmable variable resistor configured to provide a bias magnitude of the output transistor that sets a power of the driver circuit to be commensurate with a data-rate of the input signal,
wherein the driver circuit is a first driver stage and further comprising a second driver stage, the second driver stage comprising:
an additional output transistor that is biased to provide a second stage output signal in response to the output signal from the first driver stage; and
at least one additional programmable variable resistor configured to set a bias magnitude that is commensurate with a data rate of the output signal from the first driver stage,
wherein the second driver stage further comprises a bias transistor configured as a level-shifting diode-connected transistor associated with the bias magnitude of the additional output transistor, the additional output transistor being biased by the output signal of the first driver stage such that the second stage output signal has a level-shifted magnitude.

2. A magnetic disk write system comprising the driver circuit of claim 1.

3. The magnetic disk write system of claim 2, wherein the data-rate is proportional to a radial distance of a magnetic disk write head position from a center of a magnetic disk.

4. A driver circuit comprising:
an output transistor that is biased to provide an output signal in response to an input signal; and
at least one programmable variable resistor configured to provide a bias magnitude of the output transistor that sets a power of the driver circuit to be commensurate with a data-rate of the input signal,
wherein the driver circuit is a first driver stage and further comprising a second driver stage, the second driver stage comprising:
an additional output transistor that is biased to provide a second stage output signal in response to the output signal from the first driver stage;
at least one additional programmable variable resistor configured to set a bias magnitude that is commensurate with a data rate of the output signal from the first driver stage,
wherein the second driver stage further comprises a bias transistor configured as a level-shifting diode-connected transistor associated with the bias magnitude of the additional output transistor, the additional output transistor being biased by the output signal of the first driver stage such that the second stage output signal has a level-shifted magnitude; and an output stage comprising at least one current source that is activated in response to a logic-state of the second stage output signal.

5. The driver circuit of claim 4, wherein a resistance value of each of the at least one programmable variable resistor is controlled via a digital resistance selection signal.

6. The driver circuit of claim 5, wherein each of the at least one programmable variable resistor comprises a first resistor and at least one additional current path, the at least one additional current path being selectively coupled in parallel with the resistor based on the digital resistance selection signal.

7. The driver circuit of claim 6, wherein each of the at least one additional current path comprises a transistor and a second resistor in series with the transistor, the transistor being activated in response to a bit associated with the digital resistance selection signal.

8. A method of driving an input signal for providing different output signals associated with different data rates of the input signal, the method comprising:
determining a first data rate and second data rate of the input signal;
programming a first bias circuit for providing a first bias magnitude commensurate with the first data-rate of the input signal;
programming a second bias circuit for providing a second bias magnitude commensurate with the second data-rate of the input signal;
providing a first, analog out signal associated with a first amount of power in response to receiving the first bias magnitude; and
for providing a second, analog output signal associated with a second amount of power in response to receiving the second bias magnitude;
providing the output signal to at least one subsequent driver stage, the at least one subsequent driver stage comprising at least one additional programmable variable resistor;
level-shifting the output signal to a level-shifted magnitude at the at least one subsequent driver stage to provide a level-shifted output signal; and
activating at least one current source in response to a logic-state of the level-shifted output signal.

* * * * *